(12) United States Patent
Reinart

(10) Patent No.: US 9,798,617 B2
(45) Date of Patent: Oct. 24, 2017

(54) COMBINED ASYNCHRONOUS AND SYNCHRONOUS FOUNTAIN CODE STORAGE IN AN OBJECT STORE

(71) Applicant: Quantum Corporation, San Jose, CA (US)

(72) Inventor: John Reinart, Roseville, MN (US)

(73) Assignee: Quantum Corporation, San Jose, CA (US)

( * ) Notice: Subject to any disclaimer, the term of this patent is extended or adjusted under 35 U.S.C. 154(b) by 0 days.

(21) Appl. No.: 15/089,968

(22) Filed: Apr. 4, 2016

(65) Prior Publication Data

US 2016/0217039 A1 Jul. 28, 2016

Related U.S. Application Data

(63) Continuation of application No. 14/179,726, filed on Feb. 13, 2014, now Pat. No. 9,304,852.

(51) Int. Cl.
*G06F 11/10* (2006.01)
*G06F 17/30* (2006.01)
(Continued)

(52) U.S. Cl.
CPC ........ *G06F 11/1076* (2013.01); *G06F 11/10* (2013.01); *G06F 17/30082* (2013.01);
(Continued)

(58) Field of Classification Search
CPC ........... G06F 11/1076; G06F 17/30082; G06F 2211/1023; G06F 11/1068; H03M 13/373
(Continued)

(56) References Cited

U.S. PATENT DOCUMENTS 8,037,391 B1 * 10/2011 Jung .................... G06F 11/1076
714/758
8,296,515 B1 * 10/2012 Saxena ............... G06F 11/1076
711/114
(Continued)

OTHER PUBLICATIONS

Non-Final Office Action dated Aug. 14, 2015 for U.S. Appl. No. 14/179,726.
(Continued)

*Primary Examiner* — James C Kerveros
(74) *Attorney, Agent, or Firm* — Eschweiler & Potashnik, LLC

(57) ABSTRACT

Example apparatus and methods produce a set of rateless erasure codes (e.g., fountain codes) for a file stored in a primary data store (e.g., hard drive) or in an archive system. The archive system may store the file in a redundant array of independent disks (RAID). A first subset of the rateless erasure codes are stored in an object storage using a synchronous protocol. A second subset of rateless erasure codes are stored in the object storage using an asynchronous protocol. The object storage system may inform the archive system when desired redundancy has been achieved or when desired redundancy has been lost. The archive system may buffer rateless erasure codes before providing the codes to the object storage to improve performance. A failure in the archive system or object storage system may be mitigated by retaining the file in the primary data store until the desired redundancy is achieved.

20 Claims, 10 Drawing Sheets

(51) Int. Cl.
*H03M 13/15* (2006.01)
*H03M 13/37* (2006.01)

(52) U.S. Cl.
CPC ....... *H03M 13/154* (2013.01); *H03M 13/373* (2013.01); *H03M 13/3761* (2013.01); *G06F 11/1068* (2013.01)

(58) Field of Classification Search
USPC .......................................................... 714/763
See application file for complete search history.

(56) References Cited

U.S. PATENT DOCUMENTS

| | | |
|---|---|---|
| 8,386,838 B1 | 2/2013 | Byan |
| 9,026,867 B1 * | 5/2015 | Northcott ............ G06F 11/1048 365/185.09 |
| 2007/0136525 A1 | 6/2007 | Read |
| 2010/0083069 A1 * | 4/2010 | Wylie .................. H03M 13/01 714/752 |
| 2011/0113282 A1 | 5/2011 | De Spiegeleer et al. |
| 2012/0054583 A1 | 3/2012 | Park et al. |
| 2014/0068386 A1 | 3/2014 | Chen et al. |

OTHER PUBLICATIONS

Notice of Allowance dated Dec. 3, 2015 for U.S. Appl. No. 14/179,726.

* cited by examiner

COMBINED ASYNCHRONOUS AND SYNCHRONOUS FOUNTAIN CODE STORAGE IN AN OBJECT STORE

CROSS REFERENCE TO RELATED APPLICATIONS

This application is a continuation application claiming priority to U.S. patent application Ser. No. 14/179,726 filed on Feb. 13, 2014 in the name of John Reinart entitled "Combined Asynchronous and Synchronous Fountain Code Storage in an Object Store" and is hereby incorporated in its entirety.

BACKGROUND

File systems store files and store information about files. The information stored in files may be referred to as data. The information about files may be referred to as metadata. The metadata may include, for example, a file name, a file size, and other information. Some of the metadata for an individual file may be stored in a data structure known as an inode. The inodes and metadata for a file system may be stored collectively. Different approaches may be used to protect files and information about files associated with a file system. For example, an object store may interact with an archive system to store a file or information about a file located in a primary storage space (e.g., disk). To insure data protection, different approaches for storing redundant copies of a file or portions of a file have been employed. Erasure codes are one such approach.

An erasure code is a forward error correction (FEC) code for the binary erasure channel. The FEC facilitates transforming a message of k symbols into a longer message with n symbols such that the original message can be recovered from a subset of the n symbols, k and n being integers. The original message may be, for example, a file. The fraction r=k/n is called the code rate, and the fraction k'/k, where k' denotes the number of symbols required for recovery, is called the reception efficiency. Optimal erasure codes have the property that any k out of the n code word symbols suffice to recover the original message. Optimal codes may require extensive memory usage, CPU time, or other resources when n is large.

Erasure codes are described in coding theory. Coding theory is the study of the properties of codes and their fitness for a certain purpose (e.g., backing up files). Codes may be used for applications including, for example, data compression, cryptography, error-correction, and network coding. Coding theory involves data compression, which may also be referred to as source coding, and error correction, which may also be referred to as channel coding. Fountain codes are one type of erasure codes.

Fountain codes have the property that a potentially limitless sequence of encoding symbols may be generated from a given set of source symbols in a manner that supports ideally recovering the original source symbols from any subset of the encoding symbols of size equal to or larger than the number of source symbols. A fountain code may be optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k. A rateless code is distinguished from a code that exhibits a fixed code rate.

Using a fixed-rate erasure code, a receiver missing a source symbol faces the coupon collector's problem. The coupon collector's problem involves a receiver successfully receiving an encoding symbol that it does not already have. The coupon collector's problem becomes more apparent when a traditional short-length erasure code is used because the file being backed up is split into several blocks, each serving as an original message and each being separately encoded. In this scenario, the receiver must now collect the required number of missing encoding symbols for each block. Conversely, using a rateless erasure code (e.g., fountain code), a receiver need only be able to retrieve any subset of encoding symbols larger than the set of source symbols.

Object based storage systems may employ rateless erasure code technology (e.g., fountain codes) to provide a flexible level of data redundancy. The appropriate or even optimal level of data redundancy produced using a rateless erasure code system may depend, for example, on the value of the data. The actual level of redundancy achieved using a rateless erasure code system may depend, for example, on the difference between the number of readable redundancy blocks (e.g., erasure codes) written by the system and the number of redundancy blocks needed to reconstruct the original data. For example, if twenty redundancy blocks are written and only eleven redundancy blocks are needed to reconstruct the original data that was protected by writing the redundancy blocks, then the original data may be reconstructed even if nine of the redundancy blocks are damaged or otherwise unavailable.

Conventional systems may use a pre-defined setting to determine whether a store operation will operate synchronously or asynchronously. The store operation may be the operation that is tasked with writing the redundancy blocks (e.g., erasure codes) in the object store using erasure codes. A synchronous store operation may normally generate all the redundancy blocks to be written before completing the store operation but on occasion may operate one block at a time. This approach yields the result that the optimal redundancy level is in place before the store operation signals its completion. Conversely, an asynchronous store operation may not generate all the redundancy blocks to be written before completing the store operation. An asynchronous store operation may generate the minimal number of redundancy blocks required to achieve some redundancy and protection, may then signal completion of the store operation, and may then write additional redundancy blocks until an optimal redundancy or protection is achieved. An asynchronous store operation may be faster than a synchronous store operation for achieving minimal protection. Conventional systems may be caught on the horns of a dilemma that pits achieving faster but sub-optimal redundancy against achieving slower but optimal redundancy.

Archive systems may choose not to employ the faster asynchronous store approach to avoid producing less than optimal redundancy. For example, when an archive system uses an object storage to provide a redundant tertiary copy of an original data file, it may be unacceptable to employ the faster asynchronous store approach that causes a store operation to report completion before optimal redundancy is actually achieved. Consider an archive system that uses a conventional RAID (redundant array of independent disks) (e.g., RAID-6) to provide a level of redundancy for the primary storage of original data. If the asynchronous approach is employed, and the store operation that is intended to produce another level of redundancy for the primary storage of the original data is allowed to indicate completion before optimal redundancy is actually achieved, then a desired or even required level of redundancy may not be achieved and data may be at risk. Additional risk may arise when the completion of the store operation allows the primary data storage to release the first copy of the original data. Therefore, conventional archive systems interacting with object storage systems may have been constrained to always use the slower synchronous approach.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
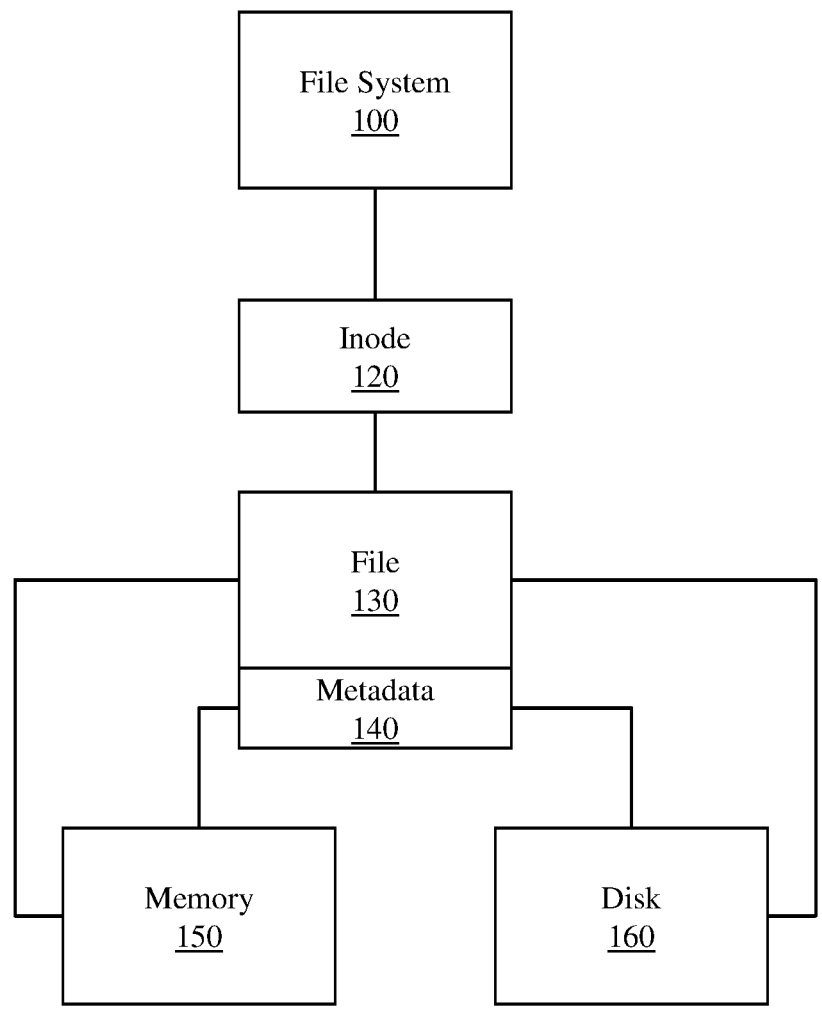
FIG. 1 illustrates a file system.

Example apparatus and methods facilitate using a combined synchronous and asynchronous store operation to simultaneously improve achieving optimal redundancy and achieving minimal redundancy in a three-level storage system, where the third level stores erasure codes in an object store. The combined synchronous and asynchronous store operation may be performed between an archive system and an object storage system that are being used to protect data for a primary data storage. Example apparatus and methods may cause the original data in the primary data storage to be retained until the store operation is complete or until optimal redundancy is achieved. Example apparatus and methods may also allow the store operation to complete faster by using a flush operation that triggers generation of redundancy blocks (e.g., erasure codes) needed to achieve optimal redundancy. In one embodiment, the original data in the primary data store is held until after the flush operation is completed. To improve speed, example apparatus and methods allow an object storage to notify an archive system that minimal redundancy has been achieved so that a transition from a slower synchronous protocol to a faster asynchronous protocol may be made. To improve reliability, example apparatus and methods also allow an object storage to notify an archive system that optimal redundancy has been lost or that an object has become unreadable so that remedial action may be taken. When the object storage notifies the archive system that an object has become unreadable or damaged, the archive system may re-invoke the store operation in an attempt to achieve optimal redundancy. In one embodiment, the archive system may re-invoke the store operation again after accessing the original data in the primary storage system.

To improve overall system speed, rather than work on a single object like conventional systems, example apparatus and methods may operate on a group of objects. The group of objects may be, for example, erasure codes associated with a number of files to be protected in the object store. Working on a group of objects may facilitate improving results through buffering. Thus, example apparatus and methods may improve or even optimize both the performance of a store operation and the time consumed to achieve optimal redundancy.

Figure one illustrates a file system 100. While a user may refer to a file 130 using a file name, the file system 100 may refer to the file 130 using an inode 120. When a change is made to the file 130, there may also be a change to the metadata 140 of the file. The metadata 140 may include, for example, the name of a file, the size of a file, and other information. In some occurrences, the updated file 130 may be stored in memory 150. Similarly, in some occurrences, the updated metadata 140 may be stored in memory 150. Ultimately, the updated file 130 and the updated metadata 140 may be stored on disk 160. The disk 160 may serve as a primary data store for the file. Users may want to have more than one copy of a file. Therefore, users may employ multi-level systems that include an archive system for a first level of redundancy and an object storage for a second or even third level of redundancy.

Figure 2:
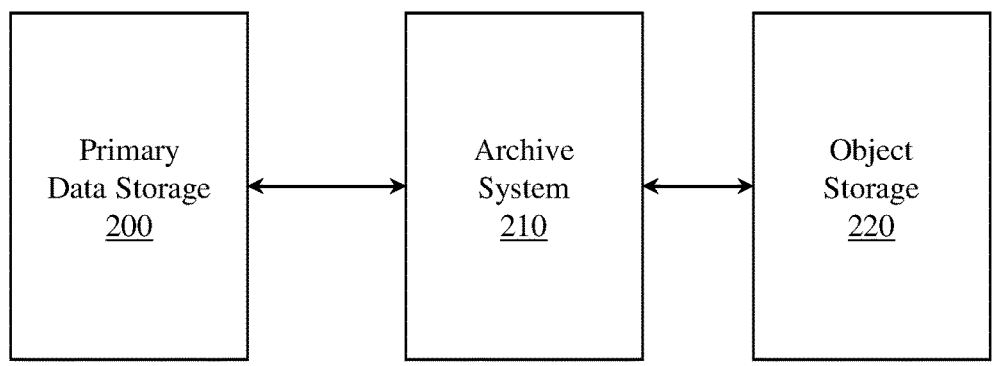
FIG. 2 illustrates an example three level system that includes a primary data storage, an archive system, and an object storage.

FIG. 2 illustrates a three level system that includes a primary data storage 200, an archive system 210, and an object storage 220. Object storage 220, which may perform object-based storage, provides a storage architecture that manages data as objects. Conversely, primary data storage 200 may manage data using a file system that manages data using a file hierarchy. Primary data storage 200 may use a block storage approach that manages data as blocks with sectors in tracks. Object storage 220 may store objects, where an object includes, for example, data to be stored, metadata about the data, a globally unique identifier, or other information. Object storage 220 may be implemented at different levels including, for example, at a device level that includes an object storage device, at a system level, at an interface level, or at other levels. Object storage 220 may provide capabilities including, for example, interfaces that may be directly programmable by an application, a namespace that can span multiple instances of physical hardware, data replication at object-level granularity, data distribution at object-level granularity, or other capabilities.

Archive system 210 may store data that is no longer in day-to-day use but still needs to be retained. A backup system may be configured to provide rapid recovery of operational data while archive system 210 may not be configured for equally rapid recovery but rather for longer term storage. Archive system 210 may be configured to store data for long periods of time (e.g., years, decades). It may take longer to retrieve data from archive system 210 than from, for example, an online backup system. However, archive system 210 may be configured to allow data to be searched. Since archive system 210 may be tasked with storing data for a long time, archive system 210 may want to have a redundant copy of a file stored in another system. Thus, archive system 210 may use object storage 220 to store redundancy blocks produced in accordance with a rateless erasure code process.

Conventionally, the archive system 210 may store a file in the object storage 220 using a store operation. Conventional systems may take an undesirably long time to complete the store operation. The performance of the store operation may be controlled, for example, by an X/Y redundancy policy (X and Y being integers, X being larger than Y). Conventionally, all X redundancy blocks may be stored by the object storage 220 before the store operation is allowed to complete. Storing all X redundancy blocks achieves optimum redundancy but storing just X-Y redundancy blocks would achieve a minimum acceptable redundancy. Storing all X blocks takes longer than storing just X-Y blocks. However, simply reporting completion after X-Y blocks have been stored may also be undesirable because the required redundancy may not be achieved.

Example apparatus and methods apply a hybrid approach where a store operation may store the minimum X-Y blocks using a synchronous approach and then store the remaining blocks using an asynchronous approach. In one embodiment, the asynchronous approach may use a flush functionality and/or a notify functionality to improve processing time and reliability. Example apparatus and methods may cause the original copy of the data being protected by the store operation to be retained in the primary data storage until the total X blocks have been stored. If an error occurs after the X-Y blocks have been stored but before all the X blocks have been stored, then the store operation may be re-invoked using, if needed, the original data that was retained in the primary data storage. Retaining a copy of the data that is being protected by the store operation outside the archive system 210 and outside the object storage 220 facilitates mitigating issues that may arise when an error occurs inside the archive system 210 or the object storage 220. Thus, example apparatus and methods may cause a minimum number of redundancy blocks to be stored using a synchronous approach but may then cause the remaining redundancy blocks to be stored using an asynchronous approach. In one embodiment, the asynchronous portion may have flush and notify capabilities. In one embodiment, the archive system 210 may use the object storage 220 as a third (or Nth, n being an integer greater than or equal to three) copy of data. In this embodiment, the archive system 210 may asynchronously store all of the blocks.

Figure 3:
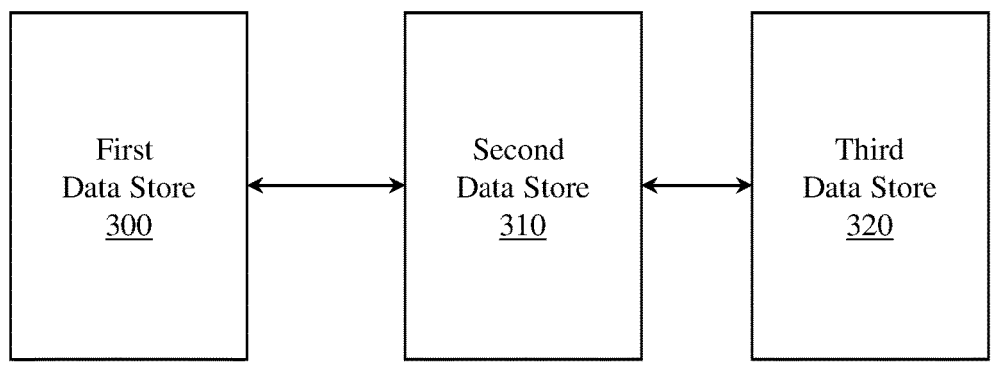
FIG. 3 illustrates an example three level data store system.

FIG. 3 illustrates a more general three level storage hierarchy than that illustrated in FIG. 2. The more general three level storage hierarchy includes a first data store 300, a second data store 310, and a third data store 320. Example systems and methods may seek to protect a file that is present in the first data store 300 by archiving the file in the second data store 310 and by storing a redundant copy in the third data store 320. The first data store 300 may be associated with, for example, a file system, and thus may be configured to support file system operations. The second data store 310 may be associated with, for example, long term storage and thus may be configured to support archival operations. The third data store 320 may be associated with, for example, object storage, and thus may be configured to support object retrieval.

Figure 4:
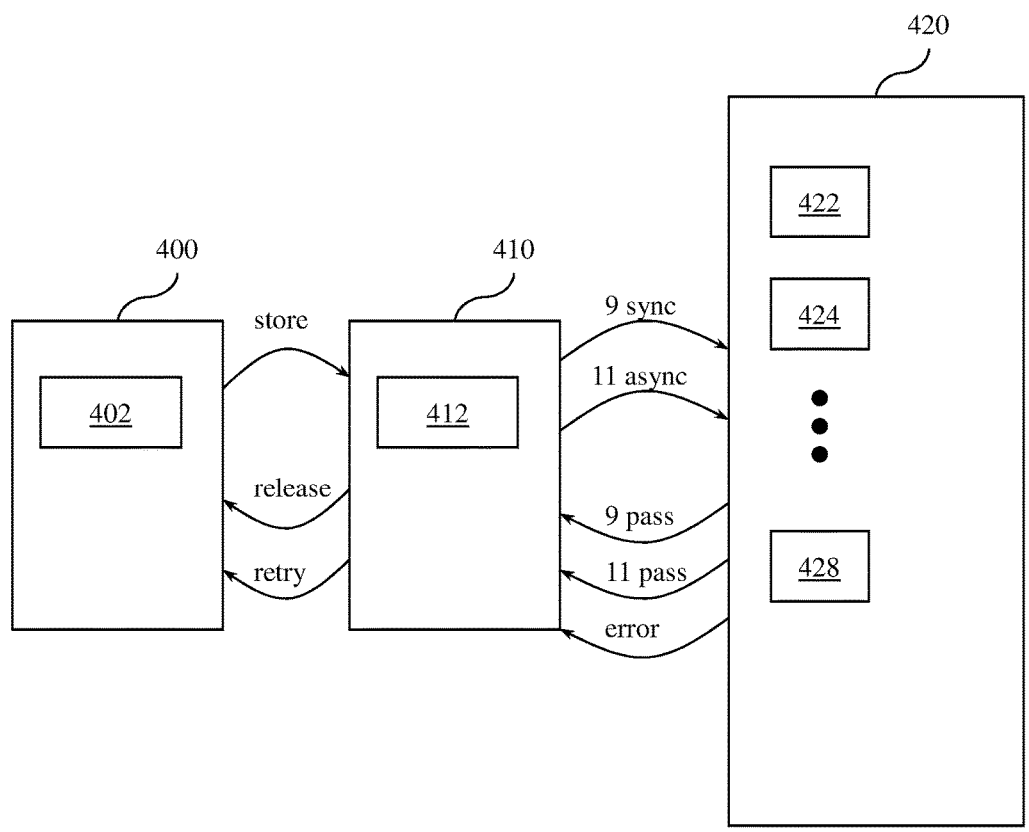
FIG. 4 illustrates example data flows and operations in a three level data store system.

FIG. 4 illustrates example data flows and operations in a three level data store system. A file 402 may be stored in a primary data storage 400 (e.g., disk). Primary data storage 400 may issue a store command to cause a copy 412 of the file 402 to be stored in a secondary data storage 410 (e.g., archive system) and a tertiary data storage 420 (e.g., object store). The store command may cause the secondary data storage 410 to produce erasure codes to be stored in the tertiary storage 420. The erasure codes may be produced according to a redundancy policy. For example, a 20/11 may indicate that twenty codes are to be written and that a message may be recovered using any nine of the twenty codes. Example apparatus and methods may, therefore, perform a combined synchronous and asynchronous approach to provide the erasure codes from the secondary storage 410 to the tertiary storage 420. For example, a 9 sync command may be employed to provide nine erasure codes to the tertiary storage 420 using a synchronous protocol and an 11 async command may be employed to provide the remaining eleven erasure codes to the tertiary storage 420. The erasure codes 422, and 424 through 428 may be stored on the tertiary storage 420. To facilitate changing from the initial slower synchronous approach to the subsequent faster asynchronous approach, the tertiary storage 420 may provide a 9 pass message to the secondary storage 410 to indicate that the first nine erasure codes have been stored. To facilitate completing the store operation, the tertiary storage 420 may also provide an 11 pass message to the secondary storage 410 to indicate that the remaining eleven erasure codes have been stored. To facilitate taking remedial action, tertiary storage 420 may also be configured to provide an error message to the secondary storage 410. The error message may cause the store operation to be restarted using the copy of the file 412, if it is still available, or the original file 402 stored on the primary data storage.

Figure 5:
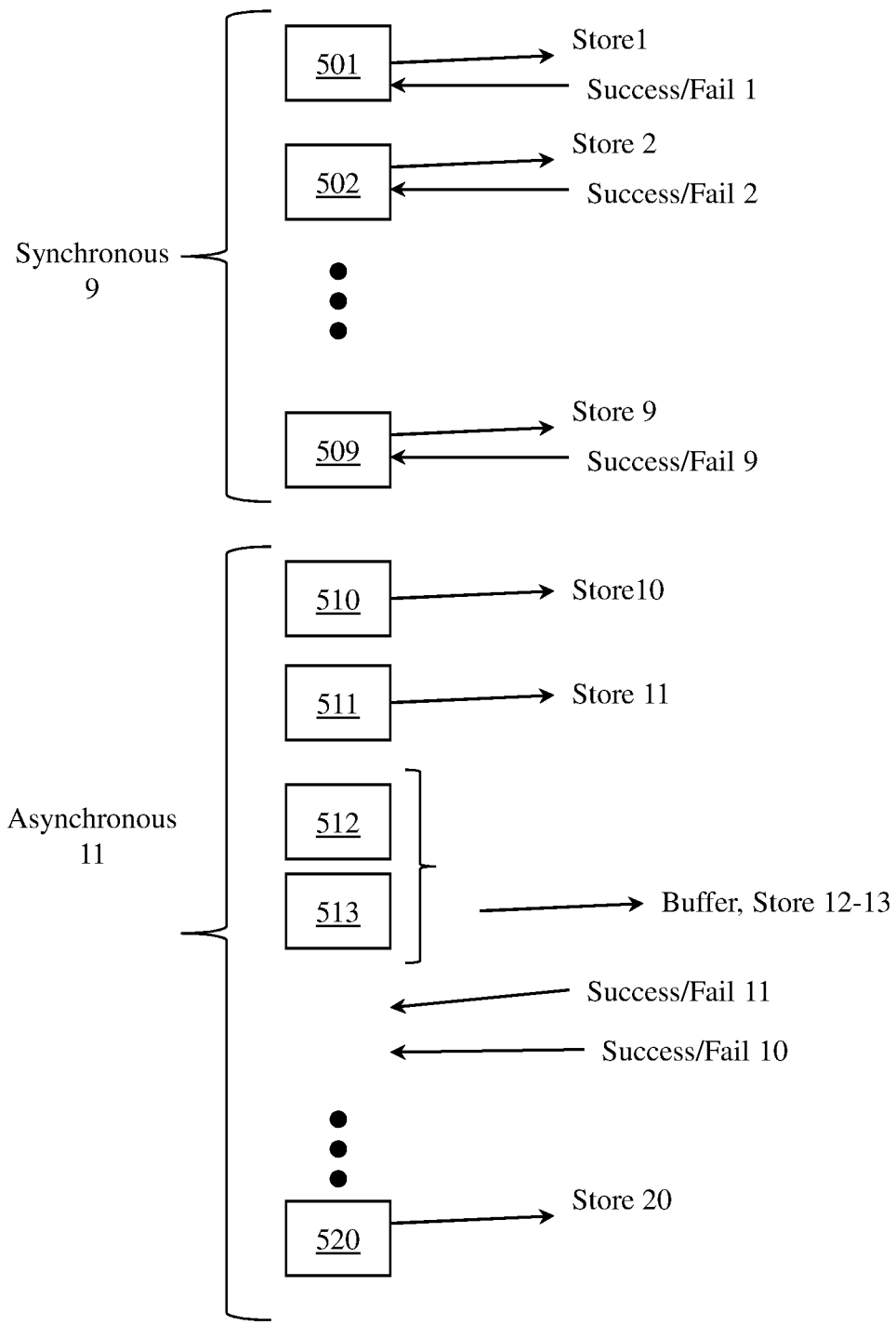
FIG. 5 illustrates example asynchronous and synchronous communications of fountain codes.

FIG. 5 illustrates differences between a synchronous protocol and an asynchronous protocol. The synchronous protocol proceeds in lock step where a store 1 message associated with storing an erasure code 501 is followed by a success 1 or fail 1 message associated with storing the erasure code 501. The store 2 message associated with storing an erasure code 502 may not be sent until after the success 1 or fail 1 message has been received. The synchronous protocol may proceed in this fashion until the desired number (e.g., 9) erasure codes have been written. In one embodiment, the synchronous protocol may produce all nine erasure codes and try to store all nine erasure codes at once, and may not proceed until all nine erasure codes have been stored. In one embodiment, the synchronous protocol may only proceed when all the erasure codes associated with an operation have been processed, thus the generation or storing of an individual erasure code may delay the completion of the collective operation.

Once the slower synchronous approach has finished, a faster asynchronous approach may be used to store the remaining (e.g., 11) erasure codes. In the asynchronous approach, store commands can be sent without waiting for a corresponding success/fail message. For example, a store 10 command associated with storing an erasure code 510 may be sent and then a store 11 command associated with storing an erasure code 511 may be sent without waiting for a response to the store 10 command. Additionally, erasure codes may be buffered to improve the performance of input/output operations. Thus, a store 12-13 command may be sent after buffering erasure codes 512 and 513. In one embodiment, in the asynchronous approach, erasure codes may be generated individually and provided individually, without concern for the status of the generating or providing of other erasure codes.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

Figure 6:
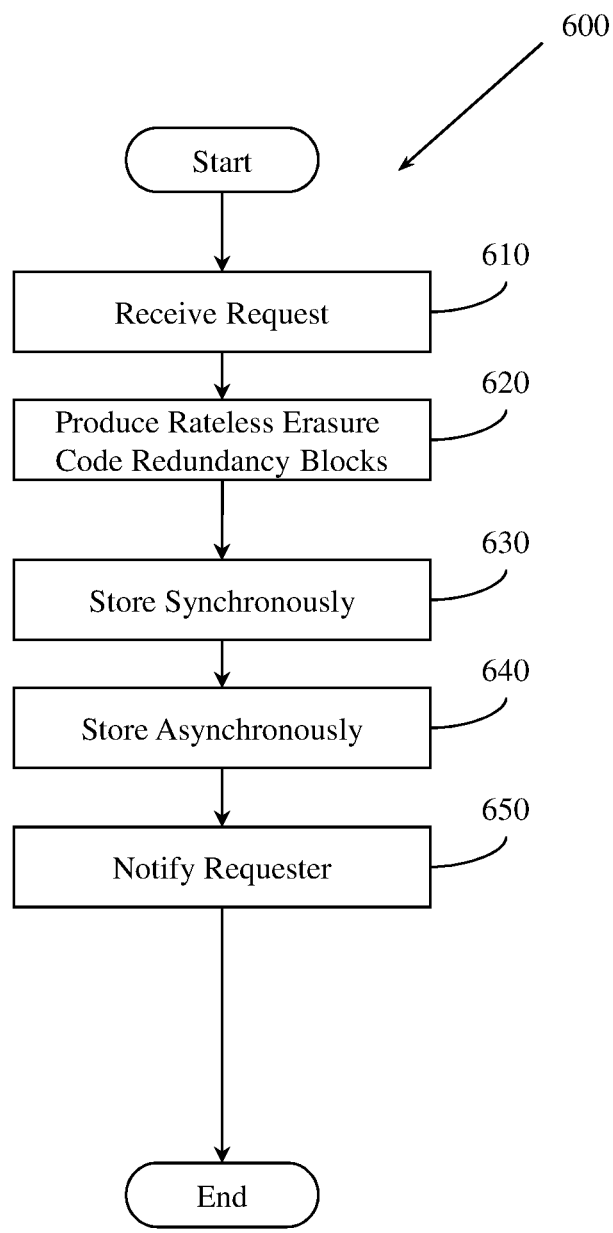
FIG. 6 illustrates an example method associated with a combined asynchronous and synchronous fountain code storage system.

FIG. 6 illustrates a method 600 associated with combined asynchronous and synchronous fountain code storage in an object store. Method 600 includes, at 610, receiving, in a second data store, a request to increase the redundancy level of a file stored in a first data store. The redundancy may be increased by storing erasure codes in a third data store. In one embodiment, the first data store may be a disk drive or drives associated with a file system or may be a memory (e.g., RAM, SSD) associated with a file system. In one embodiment, the second data store may be an archive system. The archive system may store a file using, for example a redundant array of independent disks (RAID). In one embodiment, the third data store may be an object storage system. The redundancy level for a file stored in the primary data store (e.g., disk) or secondary data store (e.g., archive system) may be increased by storing erasure codes in the tertiary data store (e.g., object store), where the erasure codes are sufficient to recover the file.

Thus, method 600 includes, at 620, producing a number of rateless erasure codes to be provided to the third data store to increase the redundancy level of the file. The number of rateless erasure codes to be produced may be controlled by a redundancy policy. The redundancy policy may identify a total number of rateless erasure codes to be stored and a minimum number of rateless erasure codes to be stored. The minimum number is less than the total number. For example a 20/11 redundancy policy may be employed to control producing twenty erasure codes, where any nine of the twenty erasure codes suffice to recreate a message (e.g., file) for which the erasure codes were produced. In one embodiment, producing the rateless erasure codes may be performed according to a user configurable code rate.

Method 600 also includes, at 630, providing the minimum number of rateless erasure codes to the third data store using a synchronous approach. In one embodiment, the synchronous approach may involve generating one erasure code and then providing the one erasure code from the second data store to the third data store and then waiting for the erasure code to be stored on the third data store before generating or providing the next erasure code. In one embodiment, the synchronous approach may involve generating all of the minimum number of rateless erasure codes, and then providing all of the minimum number of rateless erasure codes to the third data store and then waiting for the erasure codes to be stored. The synchronous approach may continue until a first number of erasure codes have been stored. The first number may be, for example, the minimum number of erasure codes needed to recover the message. Different first numbers of erasure codes may be provided using the synchronous approach. Since different numbers of erasure codes may be provided, method 600 may include determining a remaining number of rateless erasure codes equal to the difference between the total number and the minimum number.

Method 600 also includes, at 640, upon determining that the minimum number of rateless erasure codes have been stored in the third data store, providing the remaining number of rateless erasure codes to the third data store using an asynchronous approach. In one embodiment, erasure codes may be generated and provided individually. In another embodiment, all the erasure codes may be generated at once and then provided individually or in buffered groups. In the asynchronous approach, store commands for individual erasure codes or groups of buffer codes may be sent before corresponding success or failure messages are received.

Method 600 also includes, at 650, upon determining that the total number of rateless erasure codes have been stored by the third data store, sending a signal to the first data store. More generally, method 600 may include, at 650, notifying a requester concerning the progress of writing the erasure codes to produce the additional redundancy. The requester may be the data store or application that requested that a redundant copy of a file by stored. The signal may indicate that the total number of rateless erasure codes have been stored in the third data store. In one embodiment, the signal may be a control signal concerning retention of the file in the first data store. For example, the file for which erasure codes are being stored in the third data store may be retained in the first data store until the desired number of erasure codes have been stored. Thus, in one embodiment, the signal sent at 650 may control the first data store to release the file.

Figure 7:
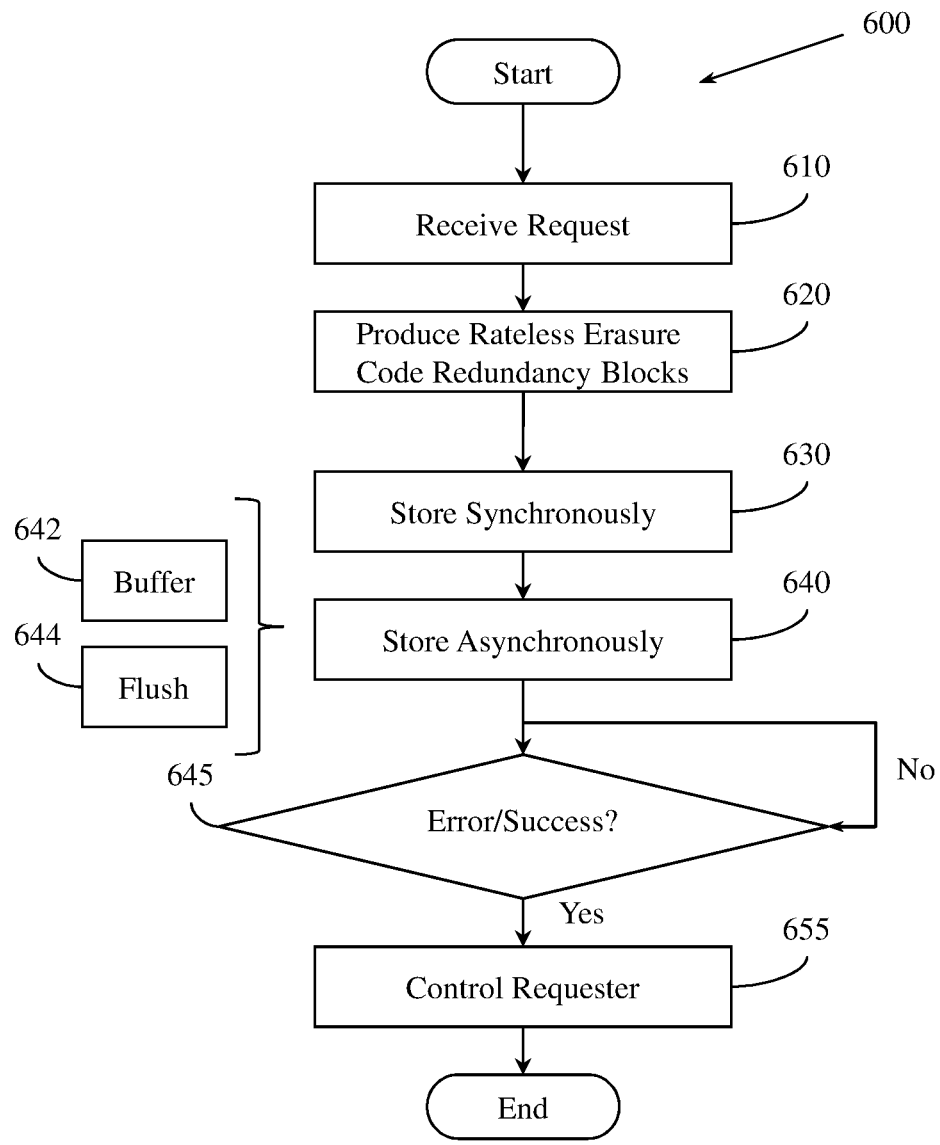
FIG. 7 illustrates an example method associated with a combined asynchronous and synchronous fountain code storage system.

FIG. 7 illustrates another embodiment of method 600. This embodiment provides more detail for the asynchronous protocol. In one embodiment, providing the remaining number of rateless erasure codes to the third data store using the asynchronous approach at 640 includes buffering one or more rateless erasure codes in the second data store at 642. The erasure codes may be buffered before providing the one or more rateless erasure codes to the third data store. Buffering the one or more rateless erasure codes at 642 may facilitate improving the performance of an input/output interface or operation. For example, four erasure codes may be buffered to produce an output block that matches the block size of an input/output interface or operation. In one embodiment, providing the remaining number of rateless erasure codes to the third data store using the asynchronous approach includes forcing a flush at 644 of a rateless erasure code from the second data store to the third data store. A flush may be used when, for example, a desired redundancy has been achieved even though erasure codes remain to be stored.

This embodiment of method 600 also includes, at 645, making a determination of whether an error or success indicator has been received. More generally, method 600 includes, at 645, determining whether a notification has been received concerning the storage of erasure codes. The notification may take different forms.

In one embodiment, method 600 may include receiving a notification from the third data store that the minimum number of rateless erasure codes have been stored in the third data store. Once the minimum number of rateless erasure codes have been written, method 600 may take different actions including, for example, releasing a local copy of the file being stored. The notification may also report that the total number of rateless erasure codes have been stored in the third data store. Once the total number of rateless erasure codes have been written, a signal may be sent to the requester to control the requester to, for example, release the copy of the file stored in the primary data storage. Thus, method 600 may include, at 655, controlling the requester.

Not all attempts to write erasure codes will succeed. Additionally, an erasure code that was stored in the third data store (e.g., object store) may be compromised, deleted, or otherwise become unavailable. Therefore, this embodiment of method 600 may include receiving a notification from the third data store that a rateless erasure code has become unavailable and, upon determining that a desired redundancy level for the file is not present, selectively re-performing a store operation using data present in the second data store or using data present in the first data store. Re-performing the store operation may include producing one or more rateless erasure codes, selectively providing one or more rateless erasure codes to the third data store using a synchronous approach, and selectively providing one or more rateless erasure codes to the third data store using an asynchronous approach.

In one example, a method may be implemented as computer executable instructions. Thus, in one example, a computer-readable medium may store computer executable instructions that if executed by a machine (e.g., processor) cause the machine to perform method 600. While executable instructions associated with method 600 are described as being stored on a computer-readable medium, it is to be appreciated that executable instructions associated with other example methods described herein may also be stored on a computer-readable medium.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
HTTP: hypertext transfer protocol.
LAN: local area network.
RAM: random access memory.
DRAM: dynamic RAM.
SRAM: synchronous RAM.
ROM: read only memory.
PROM: programmable ROM.
SSD: solid state drive
SAN: storage area network.
USB: universal serial bus.
WAN: wide area network.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a discrete logic (e.g., ASIC), an analog circuit, a digital circuit, a programmed logic device, or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

Figure 8:
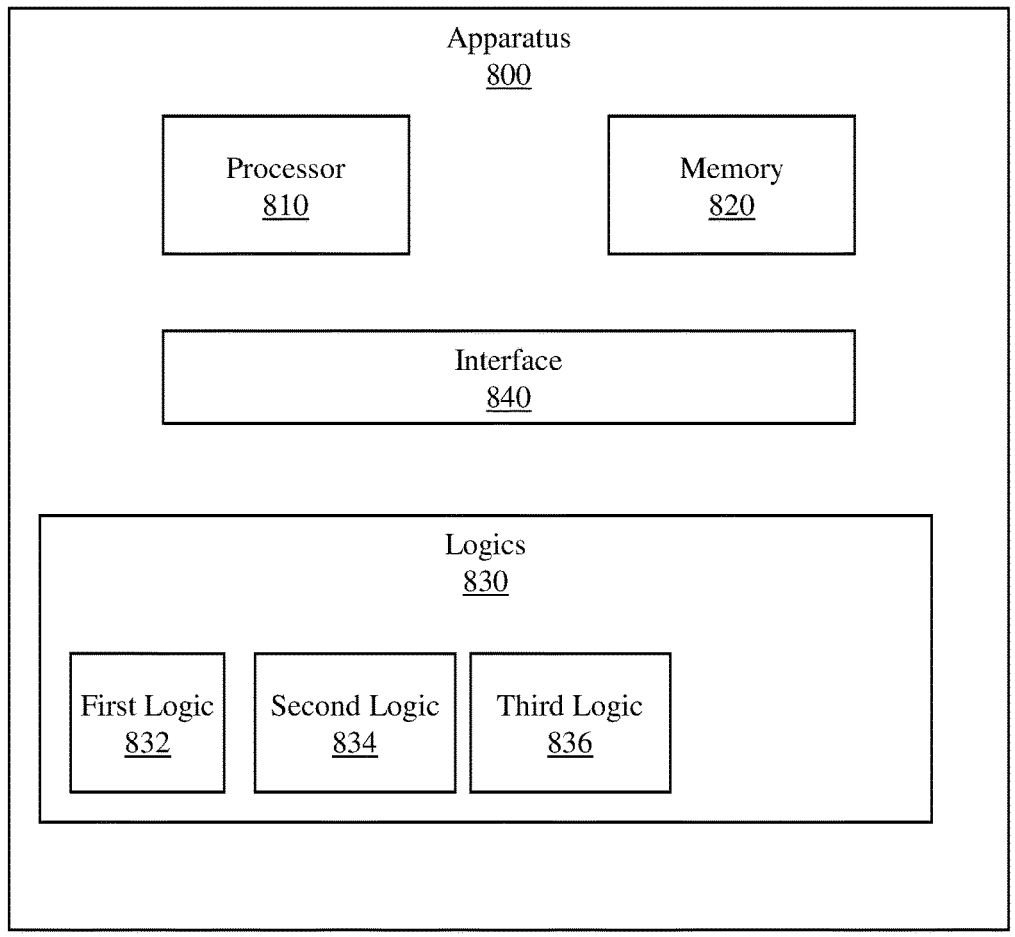
FIG. 8 illustrates an example apparatus configured to perform combined asynchronous and synchronous fountain code storage.

FIG. 8 illustrates an apparatus 800 that includes a processor 810, a memory 820, and a set 830 of logics that is connected to the processor 810 and memory 820 by an interface 840. In one embodiment, the apparatus 800 may be an archive system positioned in a communication path between a primary data storage and an object store.

The set 830 of logics may include a first logic 832 that is configured to produce a set of fountain codes for a file. The set of fountain codes are to be stored in an object store. Recall that the number of fountain codes to be generated and stored may be controlled by a redundancy policy. For example, a 20/11 policy may indicate that twenty total fountain codes are to be stored and that any nine of the fountain codes may suffice to reproduce the message (e.g., file, portion of a file) for which the fountain codes were produced. The minimum number of fountain codes required to achieve some redundancy may be stored using one approach (e.g., synchronous) and the remaining number of fountain codes may be stored using another (e.g., asynchronous) approach. The total number of fountain codes to be stored may be sub-divided in different ways.

The apparatus 800 may also include a second logic 834 that is configured to cause a first subset of the set of fountain codes to be provided to the object store using a synchronous protocol. In one embodiment, the second logic 834 may provide a fountain code to the object store and then wait to receive confirmation from the object store that the fountain code was stored before providing the next fountain code. In one embodiment, the second logic 834 may provide a group of fountain codes to the object store and then wait to receive notification from the object store concerning the group of fountain codes. In one embodiment, the second logic 834 may control the first logic 832 to produce fountain codes one at a time, or in a group, provide the individual fountain code or group to the object store, and then wait for the fountain code(s) to be stored before controlling the first logic 832 to produce another fountain code(s).

The apparatus 800 may also include a third logic 836 that is configured to cause a second, disjoint subset of the set of fountain codes to be provided to the object store using an asynchronous protocol. The third logic 836 may provide a fountain code to the object store and then provide another fountain code to the object store without waiting to receive confirmation from the object store that the first fountain code was stored. In one embodiment, the third logic 836 may control the first logic 832 to produce fountain codes without waiting for notification about the storage of a fountain code.

In one embodiment, the third logic 836 may be configured to selectively buffer members of the second subset as part of the asynchronous protocol. A first group of erasure codes may be buffered and then provided to the object store and then a second group of erasure codes may be buffered and provided to the object store before receiving confirmation that the erasure codes in the first buffer were stored. In one embodiment, the third logic 836 may be configured to selectively flush members of the second subset to the object store as part of the asynchronous protocol.

In one embodiment, the first logic 832, the second logic 834, and the third logic 836 may be configured to interact, serially or substantially in parallel, with a plurality of objects associated with two or more files. Interacting with objects associated with two or more files may facilitate increasing the efficiency of an input/output interface used to communicate erasure codes from the archive system to the object store. For example, a single erasure code may consume less than the total amount of data that can be communicated in a single communication between the archive system and the object store. If multiple files are having erasure codes written to the object store, there may be additional erasure codes waiting storage that can be used to populate a buffer.

Figure 9:
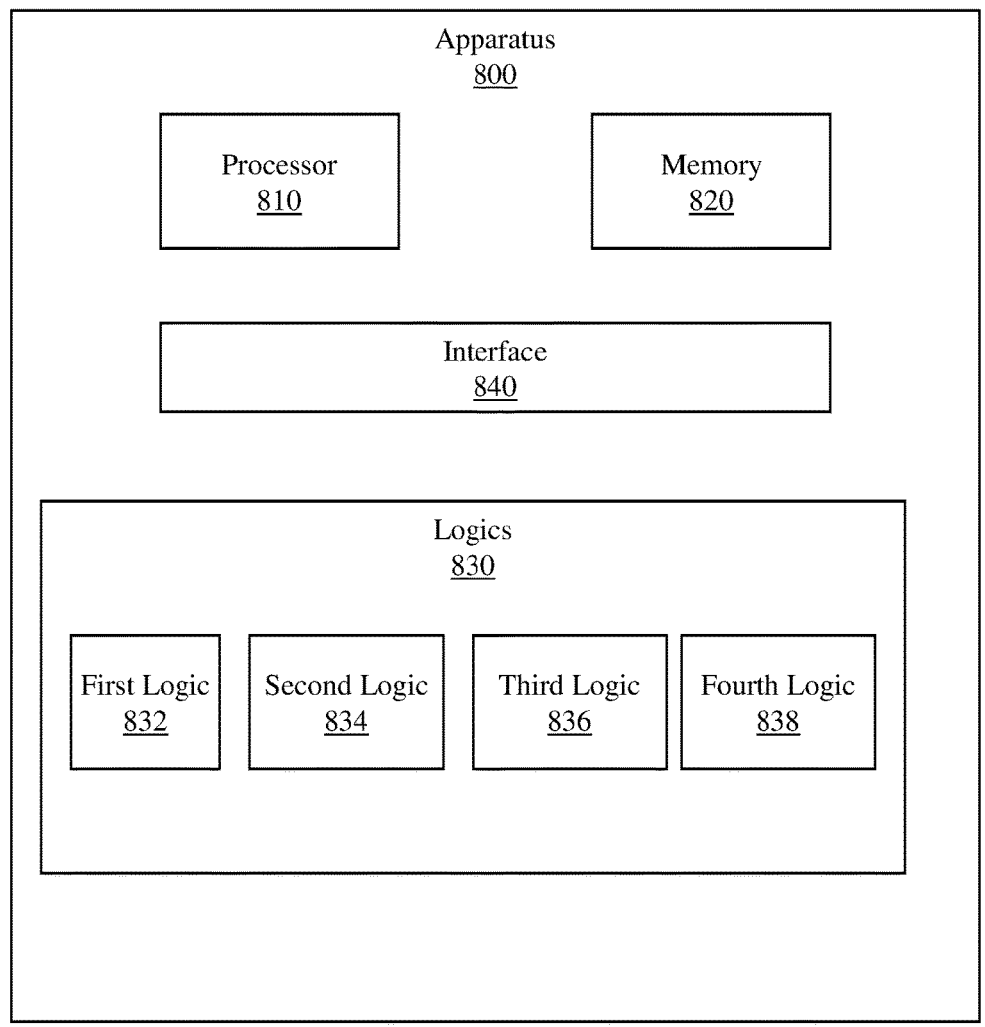
FIG. 9 illustrates an example apparatus configured to perform combined asynchronous and synchronous fountain code storage.

FIG. 9 illustrates another embodiment of apparatus 800. This embodiment includes a fourth logic 838. The fourth logic 838 may be configured to cause the file to be released from the primary data storage upon determining that the set of fountain codes have been stored in the object store. Keeping the copy of the file in the primary data storage until the erasure codes have been successfully stored in the object store facilitates maintaining a desired first level of redundancy while the desired second level of redundancy is being achieved. In one embodiment, the fourth logic 838 is configured to control the first logic 832, the second logic 834, and the third logic 836 to store in the object store additional fountain codes for the file upon determining that a threshold number of fountain codes for the file are unavailable in the object store.

Figure 10:
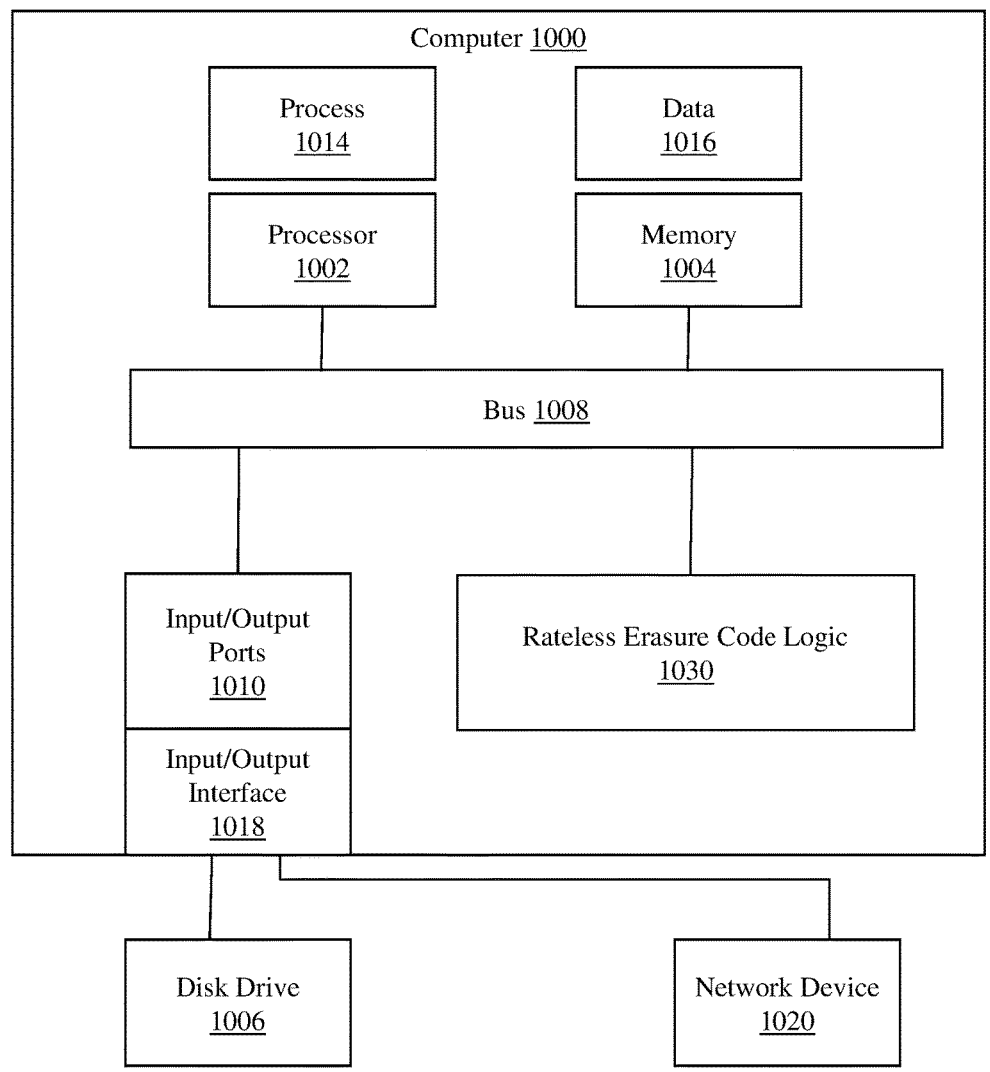
FIG. 10 illustrates an example apparatus associated with performing a combined asynchronous and synchronous fountain code storage protocol.

FIG. 10 illustrates an example computing device in which example systems and methods described herein, and equivalents, may operate. The example computing device may be a computer 1000 that includes a processor 1002, a memory 1004, and input/output ports 1010 operably connected by a bus 1008. In one example, the computer 1000 may include a rateless erasure code logic 1030 that is configured to produce and store erasure codes in an object store using a combined asynchronous and synchronous approach. In different examples, the logic 1030 may be implemented in hardware, software, firmware, and/or combinations thereof. While the logic 1030 is illustrated as a hardware component attached to the bus 1008, it is to be appreciated that in one example, the logic 1030 could be implemented in the processor 1002.

Thus, logic 1030 may provide means (e.g., hardware, software, firmware, circuit) for producing rateless erasure code redundancy blocks for a file to be replicated from an archive system to an object storage system. The rateless erasure code redundancy blocks may be, for example, fountain codes. Logic 1030 may also provide means (e.g., hardware, software, firmware, circuit) for causing rateless erasure code redundancy blocks to be stored in the object storage system using a synchronous protocol. Logic 1030 may also provide means (e.g., hardware, software, firmware, circuit) for causing rateless erasure code redundancy blocks to be stored in the object storage system using an asynchronous protocol. Causing the rateless erasure code redundancy blocks to be stored may include providing the erasure codes and control signals to the object storage. In one embodiment, a copy of the file may be maintained in a primary data storage until the synchronous protocol and the asynchronous protocol have completed successfully.

The means associated with logic 1030 may be implemented, for example, as an ASIC that implements the functionality of apparatus described herein. The means may also be implemented as computer executable instructions that implement the functionality of methods described herein and that are presented to computer 1000 as data 1016 that are temporarily stored in memory 1004 and then executed by processor 1002.

Generally describing an example configuration of the computer 1000, the processor 1002 may be a variety of various processors including dual microprocessor and other multi-processor architectures. A memory 1004 may include volatile memory and/or non-volatile memory. Non-volatile memory may include, for example, ROM, PROM, and other memory. Volatile memory may include, for example, RAM, SRAM, DRAM, and other memory.

A disk 1006 may be operably connected to the computer 1000 via, for example, an input/output interface (e.g., card, device) 1018 and an input/output port 1010. The disk 1006 may be, for example, a magnetic disk drive, a solid state disk drive, a floppy disk drive, a tape drive, a Zip drive, a flash memory card, a memory stick, or other device. Furthermore, the disk 1006 may be a CD-ROM drive, a CD-R drive, a CD-RW drive, a DVD ROM drive, a Blu-Ray drive, an HD-DVD drive, or other device. The memory 1004 can store a process 1014 and/or a data 1016, for example. The disk 1006 and/or the memory 1004 can store an operating system that controls and allocates resources of the computer 1000.

The bus 1008 may be a single internal bus interconnect architecture and/or other bus or mesh architectures. While a single bus is illustrated, it is to be appreciated that the computer 1000 may communicate with various devices, logics, and peripherals using other busses (e.g., PCIE, 1394, USB, Ethernet). The bus 1008 can be types including, for example, a memory bus, a memory controller, a peripheral bus, an external bus, a crossbar switch, and/or a local bus.

The computer 1000 may interact with input/output devices via the i/o interfaces 1018 and the input/output ports 1010. Input/output devices may be, for example, a keyboard, a microphone, a pointing and selection device, cameras, video cards, displays, the disk 1006, the network devices 1020, and other devices. The input/output ports 1010 may include, for example, serial ports, parallel ports, and USB ports.

The computer 1000 can operate in a network environment and thus may be connected to the network devices 1020 via the i/o interfaces 1018, and/or the i/o ports 1010. Through the network devices 1020, the computer 1000 may interact with a network. Through the network, the computer 1000 may be logically connected to remote computers. Networks with which the computer 1000 may interact include, but are not limited to, a LAN, a WAN, and other networks.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A non-transitory computer-readable storage device storing computer executable instructions that when executed by a computer control the computer to perform a method, the method comprising:
   receiving a request to increase the redundancy of data stored in a first data store;
   receiving the data in a second, different data store located in a computer storage device that provides an object store;
   producing a plurality of erasure codes from the data;
   selecting a first subset of erasure codes from the plurality of erasure codes, where the first subset provides a first degree of redundancy for the data;
   selecting a second subset of erasure codes from the plurality of erasure codes, where the second subset is disjoint from the first subset, where the plurality of erasure codes provides a second, greater degree of redundancy for the data;
   storing the first subset of erasure codes in the object store using a synchronous approach;
   upon determining that the first subset of erasure codes has been stored in the object store, sending a first signal to the first data store indicating that the first degree of redundancy has been achieved;
   storing the second subset of erasure codes in the object store using an asynchronous approach; and
   upon determining that the entire plurality of erasure codes has been stored in the object store, sending a second signal to the first data store indicating that the second degree of redundancy has been achieved.

2. The non-transitory computer-readable storage device of claim 1, where the number of erasure codes in the plurality of erasure codes is controlled by a redundancy policy, where the redundancy policy identifies a minimum number of erasure codes to be stored in the object store and a total number of erasure codes to be stored in the object store.

3. The non-transitory computer-readable storage device of claim 1, where storing the second subset of erasure codes in the object store using the asynchronous approach includes buffering one or more erasure codes in the second data store before storing the one or more erasure codes in the object store.

4. The non-transitory computer-readable storage device of claim 3, where storing the second subset of erasure codes in the object store using the asynchronous approach includes forcing a flush of an erasure code from the second data store to the object store.

5. The non-transitory computer-readable storage device of claim 1, the method comprising:
   upon determining that the entire plurality of erasure codes has been stored in the object store, controlling the first data store to release the data.

6. The non-transitory computer-readable storage device of claim 1, where the data is a file associated with a file system.

7. The non-transitory computer-readable storage device of claim 1, where the data is an object.

8. The non-transitory computer-readable storage device of claim 7, the object comprising, data, metadata, and a globally unique identifier.

9. The non-transitory computer-readable storage device of claim 1, where the erasure codes are rateless erasure codes.

10. An apparatus, comprising:
   a processor;
   a memory;
   a set of logics; and
   an interface that connects the processor, the memory, and the set of logics;
   the set of logics comprising:
   a first logic that produces a set of redundancy blocks for data stored in a primary data storage;
   a second logic that causes a first subset of the set of redundancy blocks to be stored in an object store using a synchronous protocol, where the first subset provides a first level of redundancy for the data; and
   a third logic that causes a second, disjoint subset of the set of redundancy blocks to be stored in the object store using an asynchronous protocol, where the second subset in combination with the first subset provides a second, greater level of redundancy for the data.

11. The apparatus of claim 10, where the third logic selectively buffers members of the second subset as part of the asynchronous protocol and selectively flushes members of the second subset to the object store as part of the asynchronous protocol.

12. The apparatus of claim 10, the apparatus being part of the object store.

13. The apparatus of claim 10, the redundancy blocks being erasure codes.

14. The apparatus of claim 10, comprising a fourth logic that causes the data to be released from the primary data storage upon determining that the set of redundancy blocks has been stored in the object store.

15. The apparatus of claim 10, where the second logic sends a first message to the primary data storage upon determining that the first subset of the set of redundancy blocks has been stored in the object store using the synchronous protocol.

16. The apparatus of claim 15, where the third logic sends a second message to the primary data storage upon determining that the second subset of the set of redundancy blocks has been stored in the object store using the asynchronous protocol.

17. The apparatus of claim 10, comprising a fourth logic that, upon determining that the primary data storage has released the data stored in the primary data storage, replicates to one or more other object stores an object associated with the data, the first subset of the set of redundancy blocks, or the second subset of the set of redundancy blocks, where the replication is performed with object-level granularity.

18. The apparatus of claim 10, comprising a fourth logic that, upon determining that the primary data storage has released the data stored in the primary data storage, distributes to one or more other object stores an object associated with the data, the first subset of the set of redundancy blocks, or the second subset of the set of redundancy blocks, where the distribution is performed with object-level granularity.

19. A client-server computer system, comprising:
   a client apparatus configured to store a first data item; and
   a server apparatus configured to provide redundancy for the first data item by storing erasure codes in an object store,
   where the client apparatus is configured to make a request to the server apparatus that the server apparatus increase the redundancy for the first data item to a desired level of redundancy;
   where the server apparatus is configured to, upon receiving the request:
      produce a set of erasure codes that are sufficient to provide the desired level of redundancy;
      select a subset of the set of erasure codes that is sufficient to provide a minimal level of redundancy;
      use a synchronous approach to cause the object store to store the subset of the set of erasure codes;
      provide a first message to the client apparatus concerning achieving the minimal level of redundancy;
      use an asynchronous approach to cause the object store to store a second, disjoint subset of the set of erasure codes, where the second, disjoint subset includes the erasure codes in the set of erasure codes that were not stored as part of the subset; and
      provide a second message to the client apparatus concerning achieving the desired level of redundancy;
   where the client apparatus is configured to, upon receiving the first message, selectively manipulate the first data item in a first way, and
   where the client apparatus is configured to, upon receiving the second message, selectively manipulate the first data item in a second different way.

20. The client-server computer system of claim 19, where selectively manipulating the first data item in a first way comprises allowing access to the data item by a file system and where selectively manipulating the first data item in the second way comprises deleting the first data item from the client system.

* * * * *